(12) United States Patent
Gotoh et al.

(10) Patent No.: US 6,281,436 B1
(45) Date of Patent: Aug. 28, 2001

(54) ENCAPSULATED SURFACE MOUNTING ELECTRONIC PART

(75) Inventors: Masashi Gotoh; Jitsuo Kanazawa; Shuichiro Yamamoto, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/499,299

(22) Filed: Feb. 7, 2000

Related U.S. Application Data

(63) Continuation of application No. PCT/JP98/03457, filed on Aug. 4, 1998.

(30) Foreign Application Priority Data

Aug. 5, 1997 (JP) .................................................. 9-223029

(51) Int. Cl.$^7$ .................................................. H05K 5/06
(52) U.S. Cl. .................. 174/52.3; 174/52.2; 174/262; 174/266; 216/17; 216/18; 438/667
(58) Field of Search .................. 174/52.2, 52.3, 174/52.4, 52.1, 261, 262, 266; 361/748, 760, 767, 768; 216/17, 18; 438/667

(56) References Cited

U.S. PATENT DOCUMENTS

| 3,772,101 | * | 11/1973 | Chumbres et al. | 156/11 |
| 5,218,761 | * | 6/1993 | Maniwa et al. | 29/852 |
| 5,985,521 | * | 11/1999 | Hirano et al. | 430/314 |

FOREIGN PATENT DOCUMENTS

| 56-29389 | 3/1981 | (JP) . |
| 59-158588 | 9/1984 | (JP) . |
| 63-1383 | 1/1988 | (JP) . |
| 63-51399 | 10/1988 | (JP) . |
| 7-106485 | * 4/1995 | (JP) . |
| 8-8417 | 1/1996 | (JP) . |
| 2571944 | 10/1996 | (JP) . |
| 10-125817 | * 5/1998 | (JP) . |
| 10-150260 | * 6/1998 | (JP) . |

* cited by examiner

Primary Examiner—Dean A. Reichard
Assistant Examiner—Carmelo Oliva
(74) Attorney, Agent, or Firm—Oblon, Spivak, McClelland, Maier & Neustadt, P.C.

(57) ABSTRACT

An electronic element is mounted on a resin wiring substrate and a cover member is bonded to the wiring substrate so as to cover the electronic element and constitute an encapsulation region. The encapsulation region houses the electronic element and has a cavity inside. A side electrode is formed of an electronically conductive through groove provided in a cover-member-bonding surface on the wiring substrate. A plating layer inside the electrically conductive through groove includes at least two metal layers including an Au plating layer and a Cu plating layer. The plating layer has conductors connected to circumferential peripheries of the electrically conductive through groove on upper and lower surfaces of the wiring substrate. Only the Cu plating layer is formed on the conductor on the upper surface of the wiring substrate to improve the reliability of bonding. The reliability of bonding of the resin wiring substrate and cover member which constitute the encapsulation region is improved, and therefore the reliability of the air-tight seal of the cavity inside the encapsulation region is improved.

6 Claims, 4 Drawing Sheets

ENCAPSULATED SURFACE MOUNTING ELECTRONIC PART

This application is a con of PCT/JP98/03457 filed Aug. 4, 1998.

TECHNICAL FIELD

The present invention relates to an improvement in the air-tightness of an electronic part in which an electronic part element is air-tightly encapsulated with a resin wiring substrate and a resin material, particularly to an encapsulation structure of an encapsulated surface-mounting electronic part, suitable for hermetically encapsulating a piezoelectric element such as a surface acoustic wave device in a cavity. That is, the encapsulated surface-mounting electronic part of the present invention has an encapsulated cavity region (vacuum or gas region) and comes under a technical field different from that of resin molding or resin casting for simply shielding an electronic part element from atmosphere.

TECHNICAL BACKGROUND

For shielding an electronic part which performs mechanical vibration (e.g., a piezoelectric element, a magnetostrictor or other movable part) from atmosphere and electrically connecting it to an external circuit to utilize the function thereof, generally, a so-called cavity encapsulation in which a space (vacuum or gas) is formed around the part is required instead of an encapsulation called molding, resin encapsulation or resin casting.

Conventionally, the cavity encapsulation is mainly carried out by means of hermetical sealing with a ceramic case, and recently, from the viewpoint of economic performances, the method of hermetical sealing with a resin material is also proposed in JP-A-9-148477, and the like.

As one example, FIGS. 4 and 5 show the outline of the structure of hermetical sealing with a conventional resin material, carried out by the present inventor. In these Figures, 1 indicates a resin wiring substrate, and an electronic part element 5 is spliced and fixed onto the resin wiring substrate 1 through a junction member (e.g., gold) 6. The electronic part element 5 is connected to an outside with a conductor on the wiring substrate 1 and via a through hole 4 formed in the wiring substrate 1 as an electrically conductive through hole. 2 indicates a resin frame substrate, a space necessary for housing the electronic part element 5 is made, a resin cover substrate 3 is placed thereon, and the wiring substrate 1 and the frame substrate 2, and the frame substrate 2 and the cover substrate 3, are hermetically bonded to each other with an adhesive. Then, the resultant set is cut in cutting positions Z to obtain individual electronic parts as shown in FIG. 5. With the conductor on the wiring substrate 1, the through hole 4 is connected to the electronic part element 5 housed in a cavity 7 surrounded by the wiring substrate 1, the frame substrate 2 and the cover substrate 3, whereby a surface-mounting electronic part using a semi-cylindrically cut through hole surface 4a as a side electrode for external connection can be constituted, and the function of the electronic part element 5 housed inside can be worked by connecting the through hole surface 4a to an external circuit.

FIGS. 6 and 7 show enlarged views of a through hole portion of the hermetical sealing structure formed of a resin material shown in FIGS. 4 and 5. In the through hole 4, a Cu plating layer 12 is coated on an inner circumferential surface by Cu plating, and an Au plating layer 13 as an uppermost layer is coated thereon through an Ni plating layer (not shown) by Au plating, for the purpose of electrically connecting conductors 10 and 11 (e.g., Cu copper foil patterns attached to the substrate) on upper and lower surfaces of the resin wiring substrate 1.

The purpose in the Au plating is to form a chemically stable surface so that the soldering performance is not degraded when the above surface mounting electronic part is exposed to atmosphere for a long period of time, since the inner surface of the through hole 4 and the external connection surface (lower side in Figure) of the wiring substrate 1 constitute soldering surfaces when the part is used. In this case, land pads 10a and 11a are provided on both sides of the through hole 4 for easy plating on the interior of the through hole and securing the reliability of connection to the patterns on the wiring substrate 1. These land pads 10a and 11a are constituted as annular portions integrally formed on end portions of the conductors 10 and 11 on the upper and lower surfaces of the resin wiring substrate 1 so as to surround the entire circumferences of peripheries of the above through hole 4. Further, the above Cu plating layer 12 to the above Au plating layer 13 as an uppermost layer are laminate-formed by the above plating procedures.

In FIGS. 6 and 7, those portions which are the same as those in FIGS. 4 and 5 are indicated by the same symbols.

DISCLOSURE OF THE INVENTION

Meanwhile, when the resin wiring substrate 1 and the resin frame substrate 2 are bonded to each other, each bonding surface is roughened by chemical treatment for improving adhesion. However, the Au land pad surface P which is a bonding surface on the upper surface side of the wiring substrate 1 (A surface formed by coating the Au plating layer 13 on the uppermost layer of the land pad 10a) is chemically stable and is not roughened so that it is a surface having decreased bonding reliability. When the wiring substrate 1 having the above Au land pad surface P and the frame substrate 2 are bonded, the minimum bonding surface distance having air-tightness reliability in shielding the cavity 7 from atmosphere is L1 which is considerably smaller than the entire width L0 of the bonding surface.

For the above reason, in the structure of cavity sealing according to prior art, it is required to dimensionally increase a product by width dimensions of the Au land pad surface P for securing a necessary L1 dimension, and when the dimensions of the product are limited, there is a problem that the reliability with regard to air-tightness decreases.

It is also thinkable to employ a method of intra-through-hole plating called a land-less through hole as shown in FIGS. 8 and 9 for narrowing a through hole pitch. Since, however, the contact area of a wiring pattern (conductor) 15 on each surface of the substrate and a conductor 16a on the inner circumference of the through hole 16 is small, the reliability of connection decreases to that degree. For example, the difference thereof is confirmed by a thermal shock test between −40° C. and 85 C. Further, when the through hole 16 is cut in a semi-cylindrical form and used as a side electrode of the above electronic part, there is caused a problem that the intra-through-hole conductor 16a may peel off due to a mechanical stress caused during the cutting, or that the terminal strength at the time of soldering to an external circuit decreases, and particularly when the through hole is cut in a semi-cylindrical form to be used as a side electrode for connecting the above part to an outside, the above method is improper.

It is an object of the present invention to improve the reliability of bonding of a resin wiring substrate and a cover member constituting an encapsulated region which surrounds an electronic part element and has a cavity inside, and to subsequently provide an encapsulated surface-mounting electronic part which can be improved in the reliability of air-tight encapsulation.

Other objects and novel characteristic features of the present invention will be made apparent in the mode of practice to be described later.

For achieving the above object, in an encapsulated surface-mounting electronic part in which an electronic part element is mounted on a resin wiring substrate, a cover member is bonded to the above wiring substrate so as to cover said electronic part element thereby to constitute an encapsulation region housing the above electronic part element and having a cavity inside, and a connection conductor path to an external circuit is formed of an electrically conductive through hole or groove made in a cover-member-bonding surface on the above wiring substrate, the present invention has characteristic features in that a plating layer on the interior surface of the above electrically conductive through hole or groove is constituted of at least two metal layers including an Au layer as an uppermost layer and a Cu layer and has conductors connected to circumferential peripheries of the above electrically conductive hole or groove on the upper and lower surfaces of the above wiring substrate, that the above Cu layer is formed on the conductors, and that the other plating layers including the above Au plating layer are not present on the conductor layer on the above upper surface in the above cover-member-bonding surface but are formed on the entire region of a pattern connecting to the external circuit on the side of the above lower surface.

In the above encapsulated surface-mounting electronic part, preferably, the semi-cylindrical electrically conductive through groove which has a form obtained by nearly dividing a circular electrically conductive through hole into two and is formed in the cover-member-bonding surface on the above wiring substrate is used as a side electrode for external connection.

Further, the above electronic part element is preferably a piezoelectric element.

Further, the above cover member preferably has a constitution in which a frame body and a cover plate are integrated by bonding them to each other.

BEST MODES FOR PRACTICING THE INVENTION

The mode of practice of the encapsulated surface-mounting electronic part according to the present invention will be explained with reference to drawings hereinafter.

Figure 1:
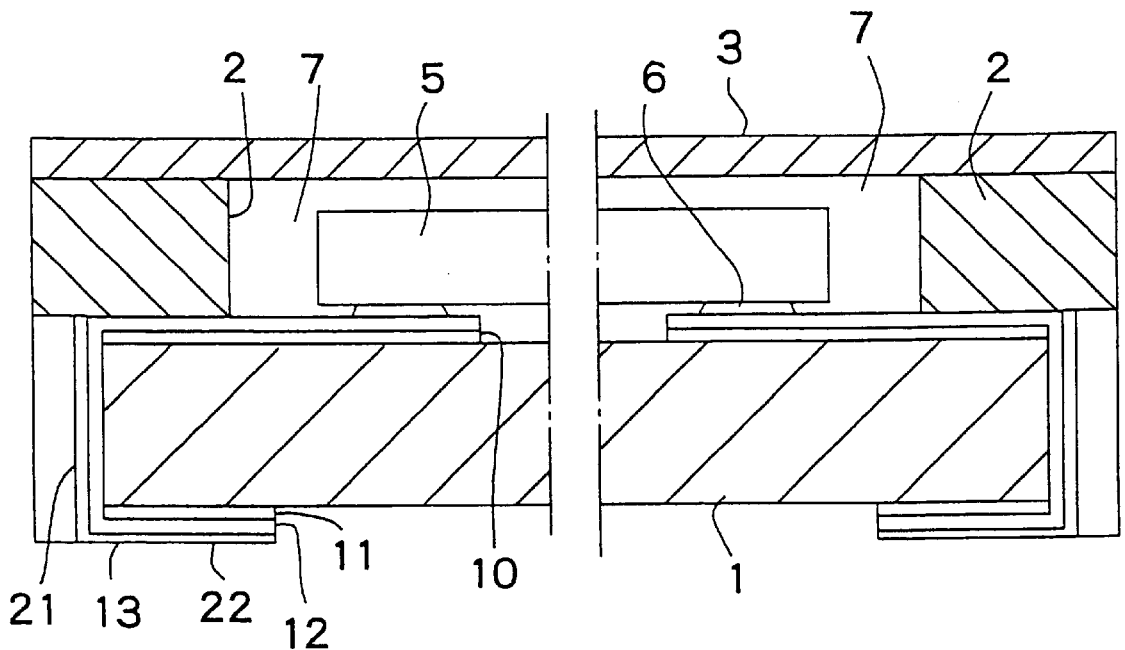
FIG. 1 is a front cross-sectional view showing the mode of practice of an encapsulated surface-mounting electronic part according to the present invention while an intermediate portion is omitted.
Figure 2:
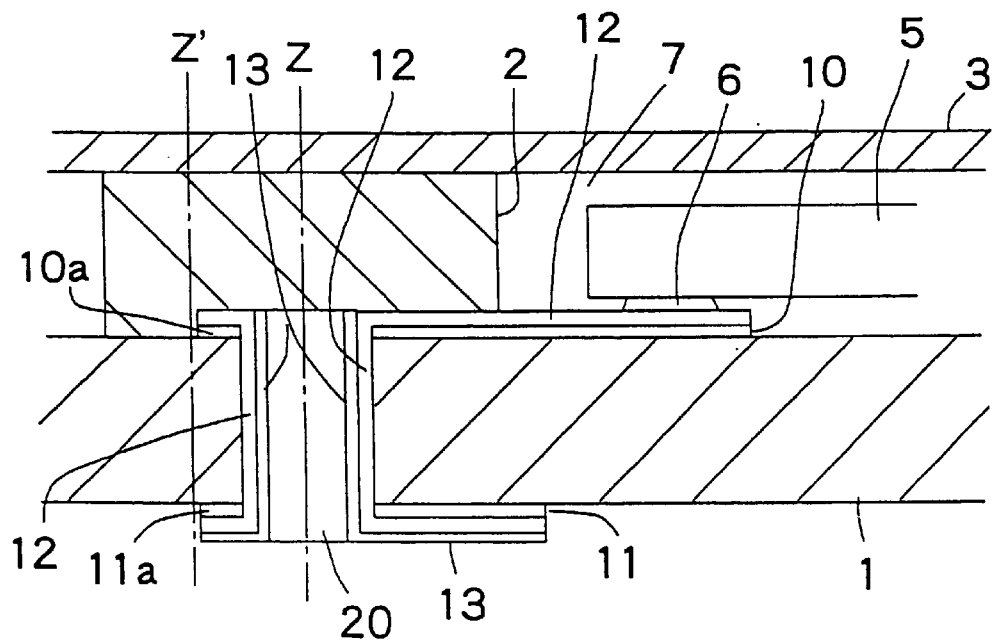
FIG. 2 is a front cross-sectional view showing the structure of vicinities of a through hole at a stage prior to the division of the through hole in the mode of practice.
Figure 3:
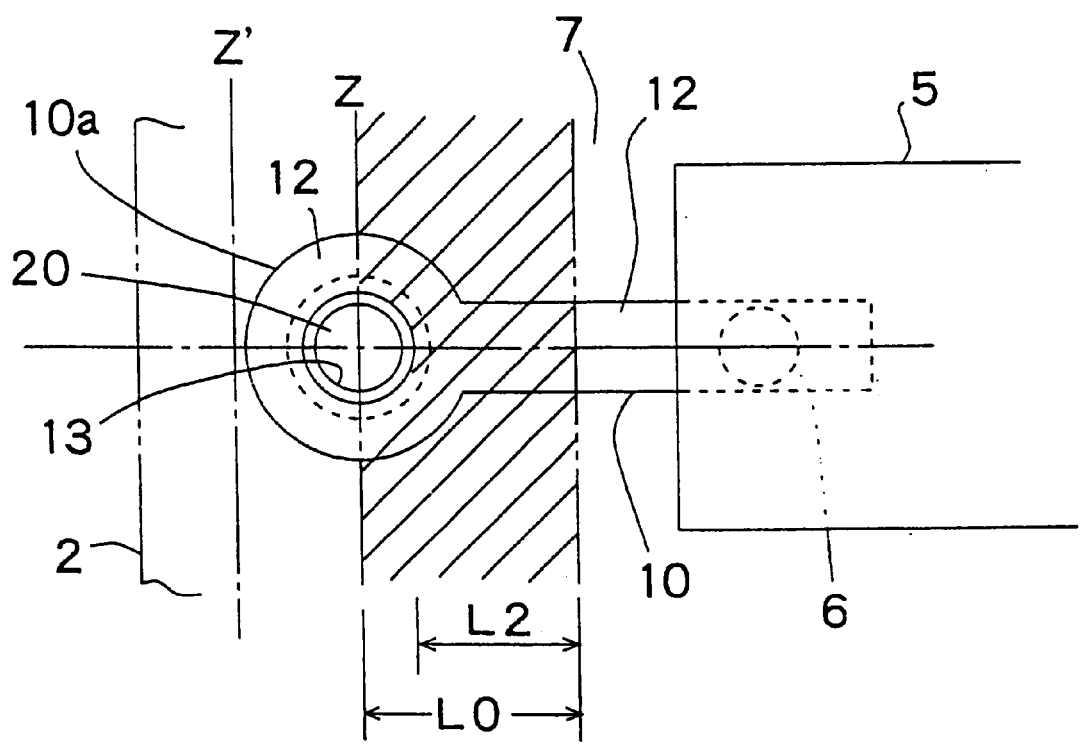
FIG. 3 is a plan view showing the structure of vicinities of a through hole at a stage prior to the division of the through hole in the mode of practice.
Figure 4:
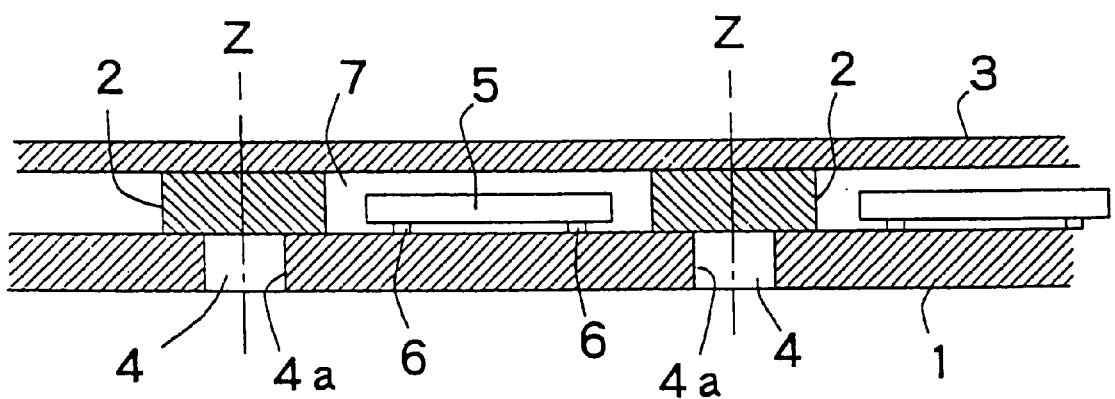
FIG. 4 is a front cross-sectional view showing the outline of structure of conventional hermetical sealing with a resin material.
Figure 5:
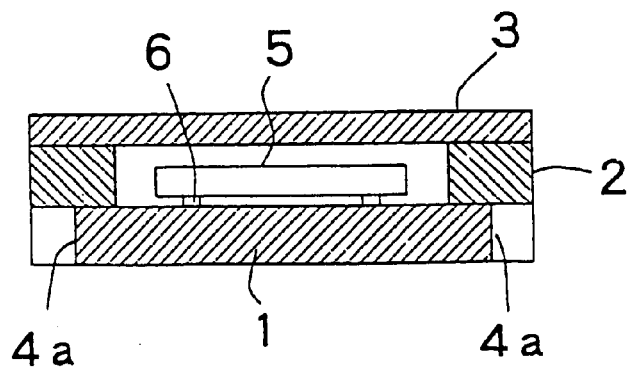
FIG. 5 is a front cross-sectional view of an encapsulated surface-mounting electronic part obtained by cutting the structure shown in FIG. 4.
Figure 6:
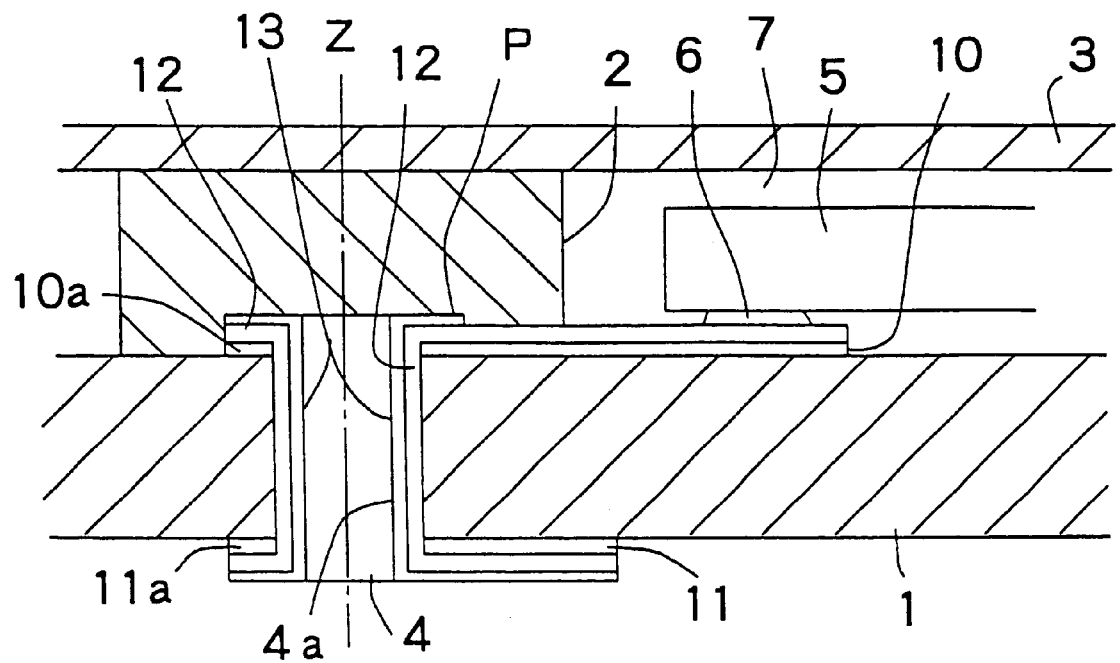
FIG. 6 is a front cross-sectional view showing a structure of vicinities of a through hole in the conventional structure of hermetical sealing with a resin material.

FIG. 1 is a front cross-sectional view showing the mode of practice of an encapsulated surface-mounting electronic part in which an intermediate portion is omitted. FIGS. 2 and 3 are a front cross-sectional view and a plan view of a through hole portion at a stage prior to cutting into individual electronic parts.

First, the constitution of a through hole portion at a stage prior to cutting into individual electronic parts will be explained with reference to FIGS. 2 and 3. In these Figures, a through hole 20 is formed by coating and forming a Cu plating layer 12 on an inner circumferential surface by Cu plating, coating and forming an Ni plating layer, etc. (not shown) thereon and then coating and forming an Au plating layer 13 thereon by Au plating, for electrically connecting a conductor 10 (e.g., a Cu foil pattern attached to a substrate) on the upper surface of a resin wiring substrate 1 and a conductor 11 on the lower surface of a resin wiring substrate 1. However, of land pads 10a and 11a on both sides of the through hole 4, the land pad 10a which is on the upper surface side of the resin wiring substrate 1 and the conductor 10 which is integrally connected thereto have the Cu plating layer 12 alone formed thereon, and a Cu surface is retained in an exposed state without forming the Ni plating layer and the Au plating layer 13. That is, for improving the adhesion of the resin wiring substrate 1 and a resin frame substrate 2, neither the Ni plating layer nor the Au plating layer 13 is formed on the surface to which the frame substrate 2 is to be bonded. In the land pad 11a which is on the lower surface side of the resin wiring substrate 1 and the conductor 11 (to form an external circuit connection pattern) which is integrally connected thereto, the Ni plating layer and the Au plating layer 13 are formed on the entire region of the Cu plating layer 12 like the inner circumferential surface of the through hole.

The resin wiring substrate 1 having the above-described structure of vicinities of the through hole and the resin frame substrate 2 are bonded to each other with an adhesive, and the resin frame substrate 2 and a resin cover substrate 3 are bonded to each other with an adhesive, for encapsulation. Then, the resultant set is cut in a cutting position Z, whereby encapsulated surface-mounting electronic parts as an individual product as shown in FIG. 1 can be obtained.

Figure 7:
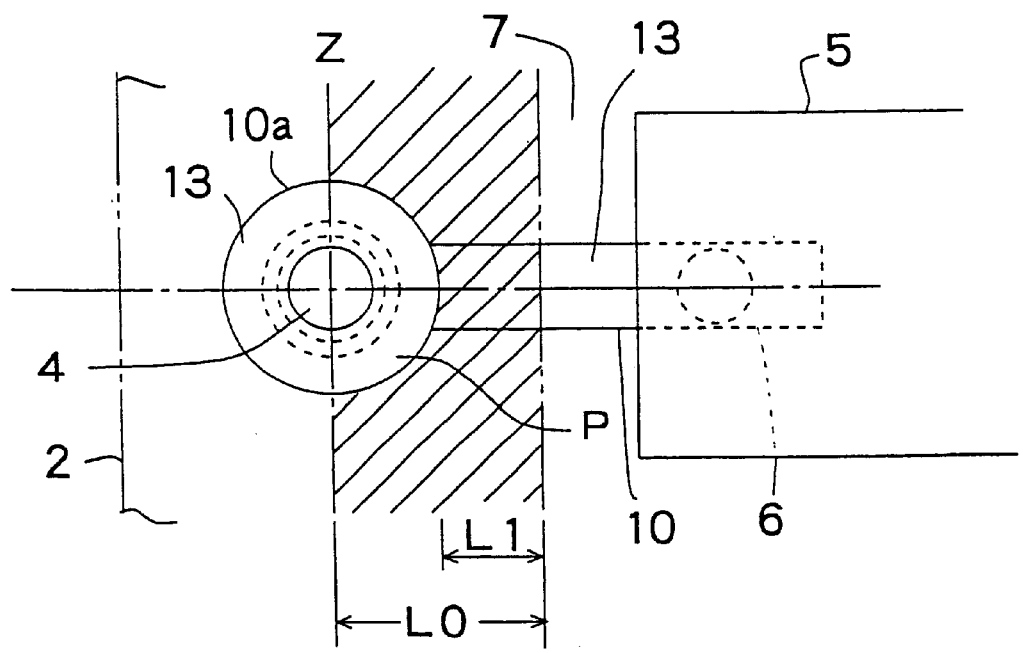
FIG. 7 is a plan view showing a structure of vicinities of a through hole in the conventional structure of hermetical sealing with a resin material.
Figure 8:
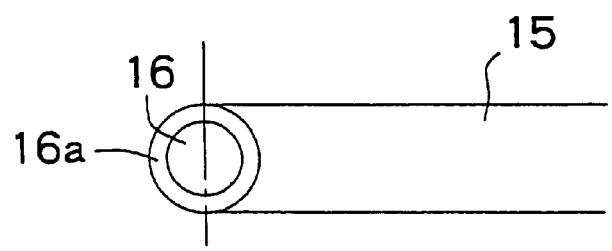
FIG. 8 is a plan view showing a substrate having a conventional land-less through hole structure.
Figure 9:
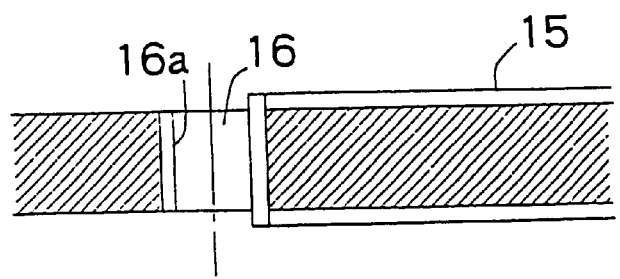
FIG. 9 is a front cross-sectional view of the substrate shown in FIG. 8.

In this case, the surfaces where the wiring substrate 1 and the frame substrate 2 are bonded to each other are constituted of a resin and Cu alone, and a bonding surface having highly reliable air-tightness can be obtained by a bonding technique (roughening technique) of a resin substrate. Therefore, the minimum bonding surface distance having air-tightness reliability for shielding a cavity 7, which air-tightly houses an electronic part element 5, from atmosphere is L2 in FIG. 3 and can be brought close into a total width L0, and it can be considerably larger than L1 in a conventional example in FIG. 7.

In the encapsulated surface-mounting electronic part in FIG. 1, the resin frame substrate 2 (frame body) and the resin cover substrate 3 (frame plate) which are air-tightly bonded to each other constitute a cover member, the electronic part element 5 such as a surface acoustic wave device as a piezoelectric element is housed and fixed in the cavity 7 inside the above cover member which is bonded so as to air-tightly cover the resin wiring substrate 1, and a semi-cylindrical electrically conductive through groove having a form formed by nearly dividing the through hole 20 in FIGS. 2 and 3 into two constitutes a side electrode 21 for external connection and functions as a connection conduction path to a bottom surface electrode 22 for external connection which electrode is constituted of an external circuit connection pattern on the lower surface of the wiring substrate 1.

The material for the resin wiring substrate 1, the resin frame substrate 2 and the resin cover substrate 3 is, for example, a BT resin (bismaleimide triazine resin), and these can be bonded to each other with a BT resin-containing prepreg.

The other constitution is like the conventional example of the structure of hermetical sealing with a resin material in FIGS. 4 to 7, and while the same numbers are assigned to the same or corresponding portions, the explanation thereof is omitted. Each plating layer can be patterned by photolithography according to a conventional method.

In the above mode of practice, the following effects can be obtained.

(1) For securing the reliability of the connection between the conductors on the upper and lower surfaces of the resin wiring substrate 1 and the bonding strength of the intra-through-hole conductor, the Cu plating layer 12 is provided with land pads on the upper and lower surfaces (is laminate-formed on the land pads 10a and 11a of the conductors) and there is provided a structure in which the Au plating layer 13 including a plating of the intermediate layer (Ni, etc.) is provided with no land pad on that surface on the upper surface side of the wiring substrate 1 to which the resin frame substrate 2 is to be bonded (i.e., a structure in which the intermediate layer and the Au plating layer 13 as an uppermost layer are not laminated on the land pad 10a). Therefore, the bonding surfaces of the wiring substrate 1 and the resin frame substrate 2 are constituted of a resin and Cu alone and can be formed into bonding surfaces having fully reliable air-tightness by a roughening technique, so that the shielding distance between the cavity 7 in which the electronic part element 5 is air-tightly housed and atmosphere can be increased to a considerable extent. For this reason, the reliability of air-tightness can be improved to a great extent.

(2) Since the land pads for Cu are provided above and below the through hole, the same intra-through-hole plating conductor bonding strength as that in conventional cases can be obtained. There is neither any decrease in connection reliability nor any decrease in terminal strength in soldering to an external circuit, which are problems with a land-less through hole structure.

In the above mode of practice, the through hole 20 in FIGS. 2 and 3 are cut and nearly divided into two in the cutting position Z to form external connection side electrodes 21 formed of a semi-cylindrical electrically conductive through groove each. By setting the cutting portion, for example, in Z' in FIGS. 2 and 3, however, the through hole 20 can be retained as it is, to be used as a connection conduction path to the bottom surface electrode 22 for external connection which electrode is constituted of an external circuit connection pattern on the lower surface of the wiring substrate 1.

Further, the cover member may be a cap-shaped resin member which is formed so as to have a concave portion inside in the beginning, instead of constituting it by bonding the resin frame substrate 2 and the resin cover substrate 3 to each other.

The present invention has been explained with reference to the above mode of practice, while it is obvious to one skilled in the art that the present invention shall not be limited thereto and permits various modifications and alterations within the specified scope of claims. So long as there is provided a structure in which the cover-member-fitting bonding surface of the wiring substrate is provided with a Cu land pad but is not provided with Ni and Au pads, the bonding reliability can be secured, the through hole can also secure the same strength as conventional strength, and the effect of the present invention remains unchanged.

EXAMPLE

By way of trial, there were prepared encapsulated surface-mounting electronic parts shown in FIGS. 2 and 3 in which L0: 0.45 mm, a through hole diameter (before plating): 0.5 mm, a land pad diameter: 0.8 mm, a thickness of a resin wiring substrate 1: 0.5 mm, a thickness of each of conductor patterns on the upper and lower surfaces of the substrate 1: 18 $\mu$m, a plating thickness of the lowermost layer Cu: about 15 $\mu$m, that of an intermediate layer Ni: about 7 $\mu$m, and that of the uppermost layer Au: 1 $\mu$m. For comparison, there were also prepared by way of trial encapsulated surface-mounting electronic parts having the conventional structure of FIGS. 6 and 7. However, due to the dimensions of the above portions, L1 in FIG. 7: 0.05 mm, and L2 in FIG. 3: 0.2 mm.

The following test, called a porosity reflow test, was carried out to compare the structure according to the mode of practice in FIGS. 2 and 3 and the conventional structure for reliability of air-tightness.

1. A prepared sample is tested for an air-tightness by a gross leak test stipulated in MIL-STD-883C to determine its initial air-tightness (a method in which a sample is immersed in a Florinate liquid for the occurrence of bubbles).

2. Then, the sample was left in a humidity of 85%RH at 85° C. to allow the sample to absorb moisture.

3. The sample which has absorbed moisture is allowed to stand at room temperature for 30 minutes, and then allowed to pass through a soldering reflow furnace at 260° C. three times.

4. The above sample is again tested for an air-tightness by the above gross leak test.

5. Time periods of standing in humidity and ratios of air-tightness failures are compared.

The results of the above comparison test were as shown in the following Table.

TABLE

Ratio of occurrence of failures in air-tightness

| Standing time period in humidity | Conventional structure (Run 1) | Conventional structure (Run 2) | Structure in mode of practice |
|---|---|---|---|
| 8 hours | 14/34 = 41% | 14/35 = 40% | 0/30 = 0% |
| 18 hours | 18/35 = 51% | 20/23 = 87% | |
| 24 hours | | | 0/30 = 0% |
| 48 hours | | | 2/30 = 7% |

As shown in the above Table, the conventional structure and the structure in the mode of practice of the present invention greatly differ in the reliability of air-tightness, and the effect of the present invention is great. In general civil-use devices and equipment, it is said that those which pass the reflow furnace three times after left in humidity for 24 hours are at an acceptance level.

Effect

As explained above, according to the encapsulated surface-mounting electronic part of the present invention, the distance used for shielding the cavity in which an electronic part element is air-tightly sealed from atmosphere can be increased by improving the bonding properties of the cover-member-bonding surface of the resin wiring substrate, so that the reliability of air-tightness can be improved. Further, since a pattern of a Cu layer (land pad) connected to the peripheral vicinities of the electrically conductive through hole or groove is provided on each of the upper surface and the lower surface of the above wiring substrate, the bonding strength of the plated conductor on the inner surface of the above electrically conductive through hole or groove can be fully secured.

What is claimed is:

1. An encapsulated surface-mounting electronic part comprising:

an electronic part element mounted on a resin wiring substrate, said resin wiring substrate having upper and lower surfaces;

a cover member bonded to said resin wiring substrate so as to cover said electronic part element thereby defining an encapsulation region, said encapsulation region housing said electronic part element and forming an internal cavity;

an electrically conductive through hole in said resin wiring substrate, said electrically conductive through hole having an interior surface and circumferential peripheries defined by the upper and lower surfaces of said resin wiring substrate;

a plating layer formed on the interior surface of said electrically conductive through hole, said plating layer further comprising metal layers including at least a Cu layer and an Au layer;

conductors on the upper and lower surfaces of said wiring substrate connected to the circumferential peripheries of said electrically conductive through hole;

wherein said Cu layer is also formed on said conductors; and wherein said metal layers other than said Cu layer are not formed on the conductor on said upper surface of said resin wiring substrate.

2. The encapsulated surface-mounting electronic part according to claim 1, wherein an electrically conductive through groove having a semi-cylindrical form obtained by dividing the electrically conductive through hole in a circular form nearly into two is used as a side electrode for external connection.

3. An encapsulated surface-mounting electronic part comprising:

an electronic part element mounted on a resin wiring substrate, said resin wiring substrate having upper and lower surfaces;

a cover member bonded to said resin wiring substrate so as to cover said electronic part element thereby defining an encapsulation region, said encapsulation region housing said electronic part element and forming an internal cavity;

an electrically conductive through groove in said resin wiring substrate, said electrically conductive through groove having an interior surface and circumferential peripheries defined by the upper and lower surfaces of said resin wiring substrate;

a plating layer formed on the interior surface of said electrically conductive through groove, said plating layer further comprising metal layers including at least a Cu layer and an Au layer;

conductors on the upper and lower surfaces of said wiring substrate connected to the circumferential peripheries of said electrically conductive through groove;

wherein said Cu layer is also formed on said conductors; and wherein said metal layers other than said Cu layer are not formed on the conductor on said upper surface of said resin wiring substrate.

4. The encapsulated surface-mounting electronic part according to claims 2, 1, or 3, wherein said electronic part element is a piezoelectric element.

5. The encapsulated surface-mounting electronic part according to claims 2, 1, or 3, wherein said cover member is a member formed by integrating a frame body and a cover plate by bonding them to each other.

6. The encapsulated surface-mounting electronic part according to claim 3, wherein the electrically conductive through groove has a semi-cylindrical form obtained by dividing an electrically conductive through hole in a circular form nearly into two and is used as a side electrode for external connection.

* * * * *